United States Patent
Pelella (10) Patent No.: US 8,638,595 B2
(45) Date of Patent: Jan. 28, 2014

(54) GLOBAL BIT SELECT CIRCUIT WITH WRITE AROUND CAPABILITY

(75) Inventor: Antonio R. Pelella, Highland Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 94 days.

(21) Appl. No.: 13/447,600

(22) Filed: Apr. 16, 2012

(65) Prior Publication Data

US 2013/0272057 A1    Oct. 17, 2013

(51) Int. Cl.
- G11C 11/00   (2006.01)
- G11C 5/06    (2006.01)
- G11C 7/10    (2006.01)

(52) U.S. Cl.
USPC ......... 365/156; 365/154; 365/63; 365/189.08

(58) Field of Classification Search
USPC .......................................... 365/154, 155, 156
See application file for complete search history.

(56) References Cited

U.S. PATENT DOCUMENTS

| | | | |
|---|---|---|---|
| 5,630,091 A | 5/1997 | Lin et al. |
| 5,729,501 A | 3/1998 | Phillips et al. |
| 5,806,084 A | 9/1998 | Lin et al. |
| 6,002,633 A | 12/1999 | Oppold et al. |
| 6,047,359 A | 4/2000 | Fouts |
| 6,058,065 A | 5/2000 | Lattimore et al. |
| 6,091,629 A | 7/2000 | Osada et al. |
| 6,529,519 B1 | 3/2003 | Steiner et al. |
| 6,633,501 B2 | 10/2003 | Wedel |
| 6,657,886 B1 | 12/2003 | Adams et al. |
| 6,876,595 B2 | 4/2005 | Bhavnagarwala et al. |
| 7,065,613 B1 | 6/2006 | Flake et al. |
| 7,102,946 B2 | 9/2006 | Pelella |
| 7,113,433 B2 | 9/2006 | Chan et al. |
| 7,170,774 B2 | 1/2007 | Chan et al. |
| 7,272,030 B2 | 9/2007 | Chan et al. |
| 7,293,209 B2 | 11/2007 | Chan et al. |
| 7,305,602 B2 | 12/2007 | Chan et al. |
| 7,336,546 B2 | 2/2008 | Chan et al. |
| 7,356,656 B1 | 4/2008 | Chang |
| 7,420,858 B2 | 9/2008 | Joshi |

(Continued)

FOREIGN PATENT DOCUMENTS

WO    2008150927 A2    12/2008

OTHER PUBLICATIONS

A. R. Pelella et al.; "A 8Kb Domino Read SRAM with Hit Logic and Parity Checker;" ESSCIRC, Grenoble, France 2005; pp. 359-362.

*Primary Examiner* — Ly D Pham
(74) *Attorney, Agent, or Firm* — Cantor Colburn LLP; William A. Kinnaman, Jr.

(57) ABSTRACT

A global to local bit line interface circuit for domino static random access memory (SRAM) devices includes a pair of complementary global write bit lines in selective communication with an array of SRAM cells through corresponding local write bit lines, the complementary global write bit lines configured to write a selected SRAM cell with write data presented on a pair of complementary write data input lines; a pair of complementary global read bit lines in selective communication with the array of SRAM cells through corresponding local read bit lines, the complementary global read bit lines configured to read data stored in a selected SRAM cell and present the read data on a pair of complementary read data output lines; and write-around logic configured to directly couple the write data presented on the complementary global write bit lines to read data output circuitry associated with the complementary global read bit lines.

20 Claims, 6 Drawing Sheets

(56) References Cited

U.S. PATENT DOCUMENTS

| | | |
|---|---|---|
| 7,463,537 B2 | 12/2008 | Chan et al. |
| 7,478,297 B2 | 1/2009 | Chan et al. |
| 7,535,776 B1 | 5/2009 | Behrends et al. |
| 7,596,050 B2 | 9/2009 | Scheuerlein et al. |
| 7,975,109 B2 | 7/2011 | McWilliams et al. |
| 2004/0083329 A1 | 4/2004 | Osada et al. |
| 2006/0268656 A1 | 11/2006 | Yokoyama |
| 2007/0127305 A1 | 6/2007 | Imai et al. |
| 2008/0056052 A1 | 3/2008 | Chan et al. |
| 2008/0247246 A1 | 10/2008 | Joshi |
| 2008/0298137 A1 | 12/2008 | Chan et al. |
| 2008/0301256 A1 | 12/2008 | McWilliams et al. |
| 2008/0310246 A1 | 12/2008 | Joshi et al. |
| 2009/0154213 A1 | 6/2009 | Kim et al. |
| 2009/0285009 A1 | 11/2009 | Kim et al. |
| 2010/0214857 A1 | 8/2010 | Hsu et al. |
| 2010/0220531 A1 | 9/2010 | Shinagawa et al. |
| 2011/0211400 A1 | 9/2011 | Chan et al. |
| 2011/0211401 A1 | 9/2011 | Chan et al. |

GLOBAL BIT SELECT CIRCUIT WITH WRITE AROUND CAPABILITY

BACKGROUND

The present invention relates generally to integrated circuit memory devices and, more particularly, to a high performance, domino Static Random Access Memory (SRAM) in which the core cells of the memory are segmented into subarrays accessed by local bit lines connected to global bit lines, with an interface between dual read and write global bit line pairs and local bit line pairs.

As will be appreciated by those skilled in the art, in a domino SRAM, the individual cells do not employ sense amplifiers to sense the differential voltage on the bit line pairs coupled to the cross-coupled inverters that store the data. Rather, for a domino SRAM, the local bit line is precharged, discharged, and the discharge is detected. The local bit line, the means to precharge the local bit line, and the detector define a dynamic node of the domino SRAM. More detailed information regarding the construction and operation of domino SRAMs may be found in U.S. Pat. Nos. 5,729,501 and 6,657,886, both assigned to the assignee of this application, and incorporated herein by reference.

In addition, U.S. Pat. No. 6,058,065, also assigned to the assignee of this application and incorporated herein by reference, discloses a memory array in which the core cells are organized in subarrays accessed by local bit lines connected to global bit lines. U.S. Pat. No. 7,113,433, also assigned to the assignee of this application and incorporated herein by reference, discloses a domino SRAM with one pair of global bit lines for a read operation and another pair of global bit lines for a write operation. An advantage of having two global bit line pairs is better overall performance in terms of faster reading from and writing to the memory cells. However, it is important that the interface from the global bit lines to the local bit line pairs does not detract from these performance gains.

SUMMARY

In an exemplary embodiment, a global to local bit line interface circuit for domino static random access memory (SRAM) devices includes a pair of complementary global write bit lines in selective communication with an array of SRAM cells through corresponding local write bit lines, the complementary global write bit lines configured to write a selected SRAM cell with write data presented on a pair of complementary write data input lines; a pair of complementary global read bit lines in selective communication with the array of SRAM cells through corresponding local read bit lines, the complementary global read bit lines configured to read data stored in a selected SRAM cell and present the read data on a pair of complementary read data output lines; and write-around logic configured to directly couple the write data presented on the complementary global write bit lines to read data output circuitry associated with the complementary global read bit lines.

In another embodiment, a method of implementing reading and writing data in domino static random access memory (SRAM) devices includes selectively coupling a pair of complementary global write bit lines in with an array of SRAM cells through corresponding local write bit lines, the complementary global write bit lines configured to write a selected SRAM cell with data presented on a pair of complementary write data input lines; selectively coupling a pair of complementary global read bit lines with the array of SRAM cells through corresponding local read bit lines, the complementary global read bit lines configured to read data stored in a selected SRAM cell and present the read data on a pair of complementary read data output lines; and configuring write-around logic to directly couple the write data presented on the complementary global write bit lines to read data output circuitry associated with the complementary global read bit lines.

BRIEF DESCRIPTION OF THE SEVERAL VIEWS OF THE DRAWINGS

Referring to the exemplary drawings wherein like elements are numbered alike in the several Figures.

DETAILED DESCRIPTION

Disclosed herein is a global bit select circuit for domino read SRAM devices that interfaces with a local bit select circuit (or group of local bit select circuits), and that uses a dual bit line approach. That is, one bit line pair is used for read operations and another bit line pair is used for write operations. More specifically, the global bit select circuit embodiments presented herein provide write-around capability. That is, the global bit select circuit has the ability to send input data directly to the outputs while bypassing the global and local read bit lines during a write operation.

Figure 1:
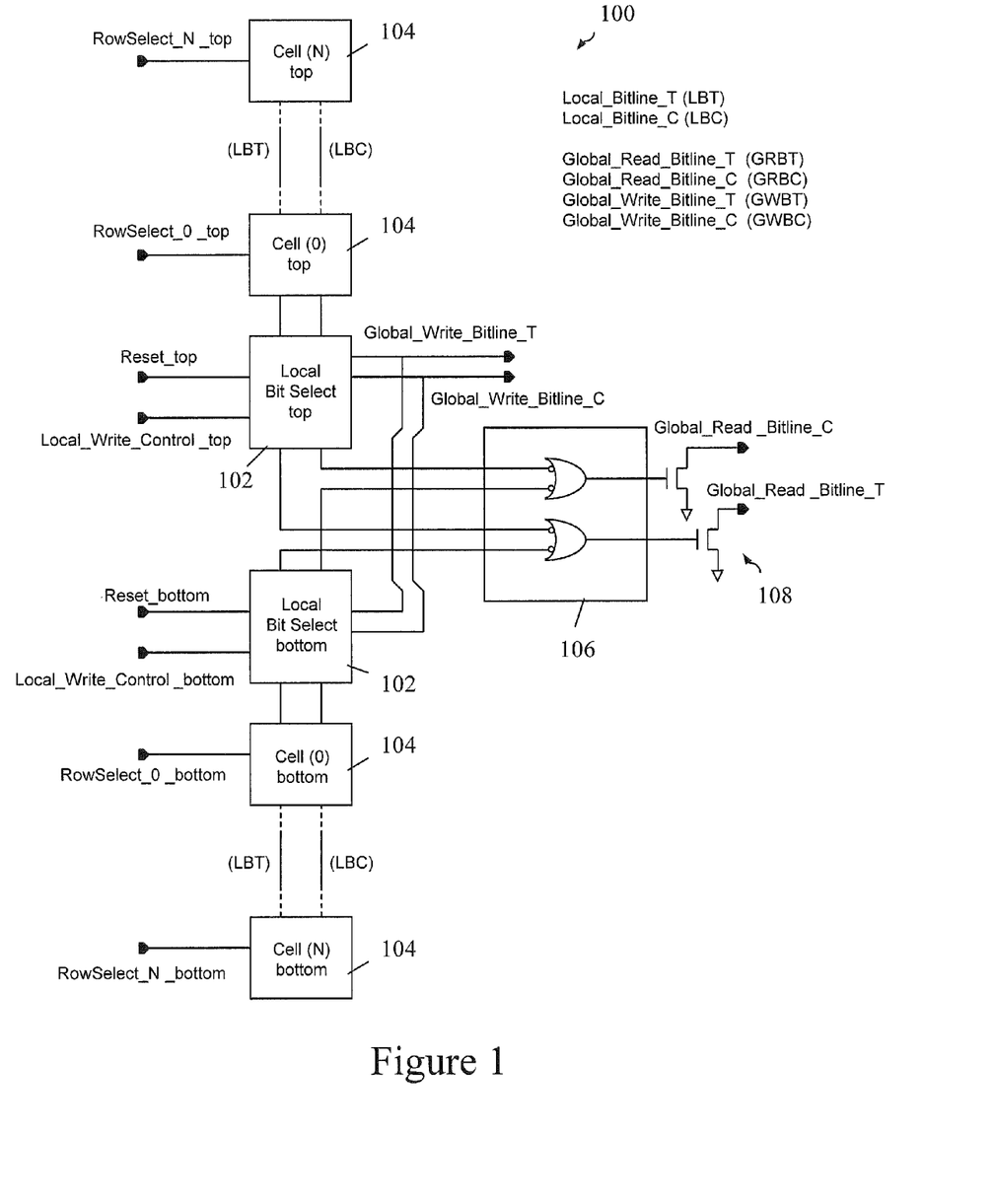
FIG. 1 is a schematic block diagram of an N-cell subarray of a domino SRAM suitable for use in accordance with an embodiment of the invention.

Referring initially to FIG. 1, there is shown a schematic block diagram of an N-cell subarray 100 of a domino SRAM suitable for use in accordance with an exemplary embodiment. The domino SRAM subarray 100 is accessed by local bit select logic 102 (top and bottom), and has 0 through N cells 102 labeled "top," as well as 0 through N cells labeled "bottom." The top and bottom cells 104 are mirrored around an active low input OR logic block 106, with half the cells on one side and half on the other. The local bit lines (labeled LBT and LBC in FIG. 1) are ORed together (i.e., the top local bit line complement (LBC) is ORed with the bottom LBC, and the top local bit line true (LBT) is ORed with the bottom LBT) to drive the wired OR NFETs (generally indicated at 108), the outputs of which are respectively connected to the complement and true global read bit lines GRBC, GRBT. In the preceding sentence and elsewhere herein, "NFET" signifies an n-channel field effect transistor (FET), while "PFET" signifies a p-channel FET.

In a standby state, the local bit lines are precharged to a logic high level. Then, for a read mode, the active memory cell (from either the top or bottom sub array) pulls down on one of the local bit lines, depending on the value of the data stored on the cell. The active low bit line, through the corresponding OR gate of block 106, turns on one of the wired OR NFETs 108 to pull down the corresponding global read bit line (GRBC or GRBT). By arranging the cells around a central point of the OR logic 106, the RC delay on the local bit lines is reduced since the distance to the furthest cell has been reduced by half. This improves the write performance as well as the read access time of the subarray.

The local bit select circuits 102, in addition to providing the read signal transfer, also provide the write control function. As further shown in FIG. 1, the top and bottom local bit select circuits 102 each have a pair of global write bit lines (GWBT and GWBC) as inputs thereto. The write operation is controlled by the local write control line (top/bottom). Further, each local bit select circuit 102 also performs, through the reset (top/bottom) signal, the bit line precharge function (also known as a bit line restore) at the end of an active read or write cycle.

Figure 2:
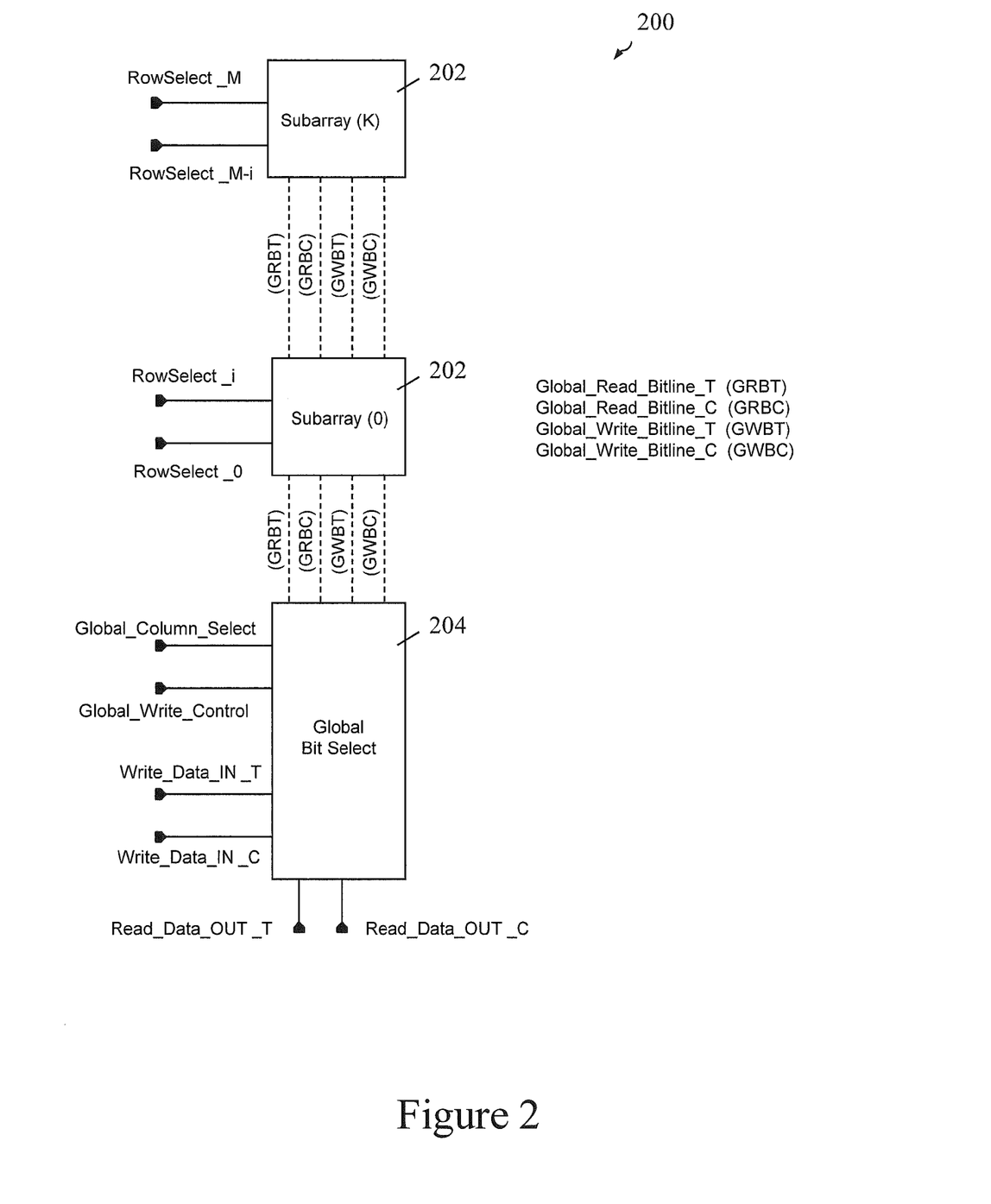
FIG. 2 is a schematic block diagram of a one-bit by M bit array of a domino SRAM where K subarrays (each containing i cells along the local bit lines) are connected to one global bit select circuit.

FIG. 2 is a schematic block diagram of a one-bit by M bit array 200 of a domino SRAM where K subarrays 202 (each containing i cells along the local bit lines) are connected to one global bit select circuit 204.

Figure 3:
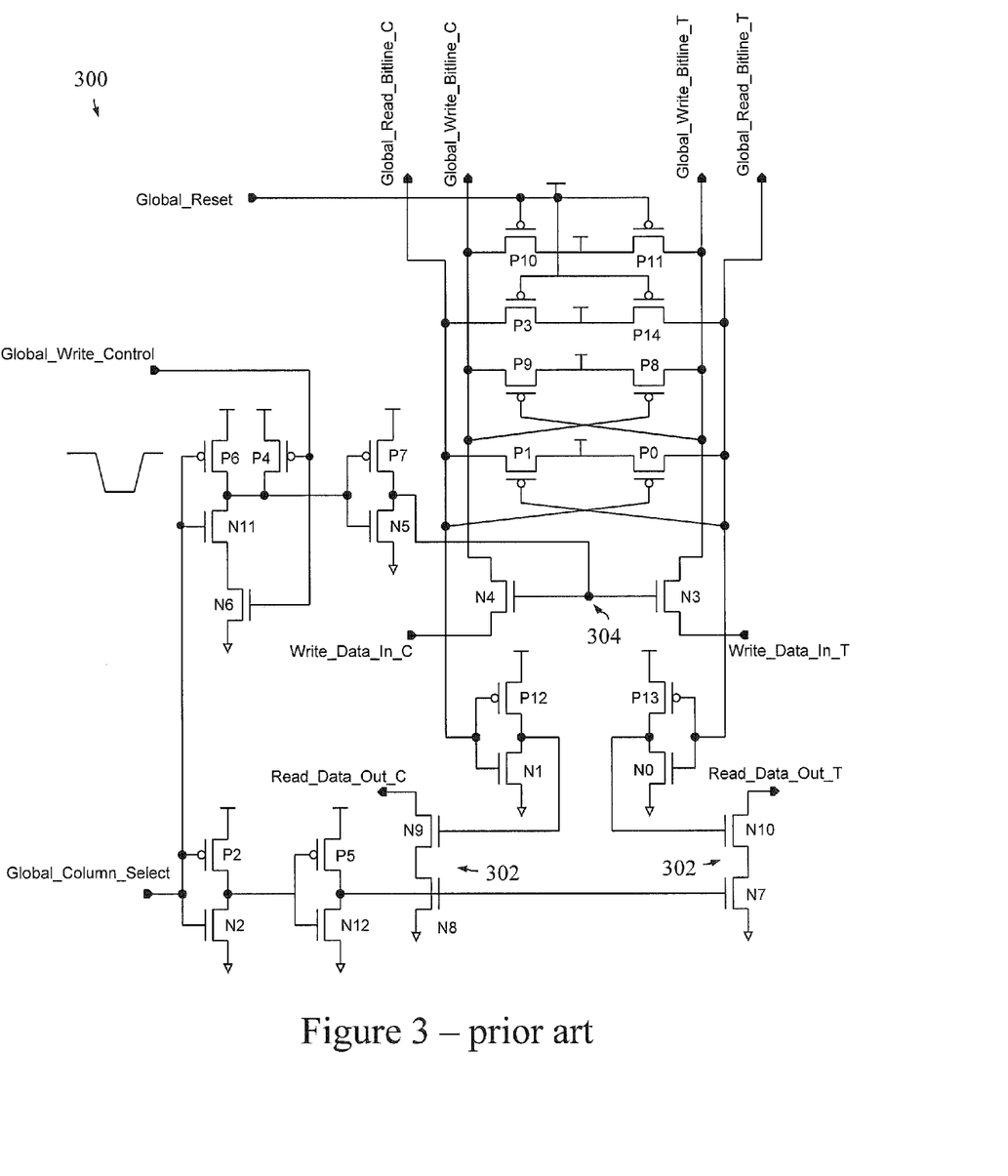
FIG. 3 is a schematic diagram of a domino SRAM global to local bit select circuit.

Referring now to FIG. 3, there is shown a schematic diagram of one implementation of a domino SRAM global to local bit select circuit 300, such as that described in the aforementioned U.S. Pat. No. 7,113,433. As is shown, the circuit 300 includes a global read bit line pair (Global_Read_Bitline_C/Global_Read_Bitline_T) as inputs thereto, and a global write bit line pair (Global_Write_Bitline_C/Global_Write_Bitline_T) as outputs therefrom. Both of the two global bit line pairs are connected to the local bit select circuits (not shown in FIG. 3) along the bit column. In addition, the circuit 300 also has a data bus, including a pair of write data inputs (Write_Data_In_C/Write_Data_In_T) and a pair of read data outputs (Read_Data_Out_C/Read_Data_Out_T). Column select signals for the circuit 300 include a Global_Column_Select signal and a Global_Write_Control signal. The Global_Column_Select signal, as the name suggests, selects the bit column for a read or a write operation. The Global_Write_Control enables the column for a write operation. Restore (precharge) of both the global read and write bit line pairs is provided by the Global_Reset signal, which is an active low signal.

In operation, when the Global_Reset signal is active low (as opposed to high during standby and read/write operations), PFET transistors P10/P11 restore the global write bit lines, while PFET transistors P3/P14 restore the global read bit lines. In addition, two pairs of cross-coupled "keep-quiet" PFET transistors (P0/P1 and P8/P9) are connected to the global read and write bit lines, respectively. When one side of the bit lines is pulled low during a read or a write operation, the corresponding PFET is turned on so to hold the opposite side of the bit line high (that is, keeping it in a quiet up level). In so doing, these cross-coupled "keep-quiet" PFETs maintain glitch-free (noise-free) read and write operations.

The Global_Column_Select input (coming from the bit decode circuitry, not shown in FIG. 3) selects the bit column for both the read and write operation, and is an active high signal. The Global_Write_Control input (also an active high signal) controls the write data bus during a write operation. In a standby mode, both the Global_Column_Select and the Global_Write_Control signals are off, while the Global_Reset signal is on (low active) to precharge both the global read and write bit lines high. Also, in the standby mode, the cross-coupled "keep-quiet" PFETs are off. The read data output bus (Read_Data_Out_C/Read_Data_Out_T) is also precharged high by data output reset circuitry (not shown in FIG. 3).

In a read mode of operation, the Global_Reset signal is first switched high, turning off the pre-charge PFETs. The Global_Column_Select input is then activated while the Global_Write_Control input is kept low (low for reading and high for writing). In so doing, the bottom NFETs (N8, N7) of the NFET stacks 302 coupled to the true and complement read data output bus become activated via the inverter pair P2/N2 and P5/N12, and will allow discharge of either Read_Data_Out_C or Read_Data_Out_T, depending on the state of the cell data. Concurrently, the common gate node 304 coupled to N3 and N4 of the circuit is kept low by the inactive Global_Write_Control signal to disable write NFETs N3/N4.

Thus, for the specific case where a "1" is read from the memory cell, Global_Read_Bitline_T will remain high, whereas Global_Read_Bitline_C will discharge. This in turn causes the output of inverter P12/N1 to go high and activate NFET N9, thereby discharging Read_Data_Out_C. Conversely, because Global_Read_Bitline_T remains high when reading a "1", the output of inverter P13/N0 remains low, keeping NFET N10 inactive and preventing the precharged Global_Read_Bitline_T from discharging. As a result, the correct complementary data is output from Global_Read_Bitline_T and Global_Read_Bitline_C.

In a write mode of operation, the Global_Reset signal is first deactivated by going high (as in the read mode), while the write data inputs (Write_Data_In_C/Write_Data_In_T) are presented with write data thereon. That is, one of the pre-charged Write_Data_In_C/Write_Data_In_T lines is pulled low while the other remains in the precharged high state. Then, both the Global_Column_Select and the Global_Write_Control inputs are both activated. Thus, in addition to driving node 304 high and activating the writing NFETs N3/N4, the bottom NFETs (N8, N7) of the NFET stacks 302 coupled to the true and complement read data output bus also become activated in the write mode.

For a specific case where a "0" is to be written to the memory cell, for example, the Write_Data_In_T signal is held low, pulling down Global_Write_Bitline_T through N3. Because Write_Data_In_C is held high, Global_Write_Bitline_C will not discharge through N4 and instead remain high. This state of the global write bit lines is passed to the local bit select circuit (not shown in FIG. 3), which in turn writes a "0" into the selected memory cell. Notably, because the output of inverter P5/N12 is also high during the write operation (due to Global_Column_Select being activated), and thus NFETs N7 and N8 are activated as mentioned above, write-through data (which is passing through from the local bit select circuit to the global read bit lines) is therefore also available on the read data output bus (Read_Data_Out_C/Read_Data_Out_T).

It is thus possible that during a write operation, if the word line rises before the global write bit line signal, the cell will begin to read by initially pulling down one of the local bit lines. Then as the write operation proceeds, the other bit line may also be pulled down (if the write operation is intended to write opposite data into the cell), leaving both Read_Data_Out_C and Read_Data_Out_T in an active, discharging state in turn resulting in a metastable "X" state at the output of the global bit select circuit. Such a condition is referred to herein as a Fast Read Before Write (FRBW).

Figure 4:
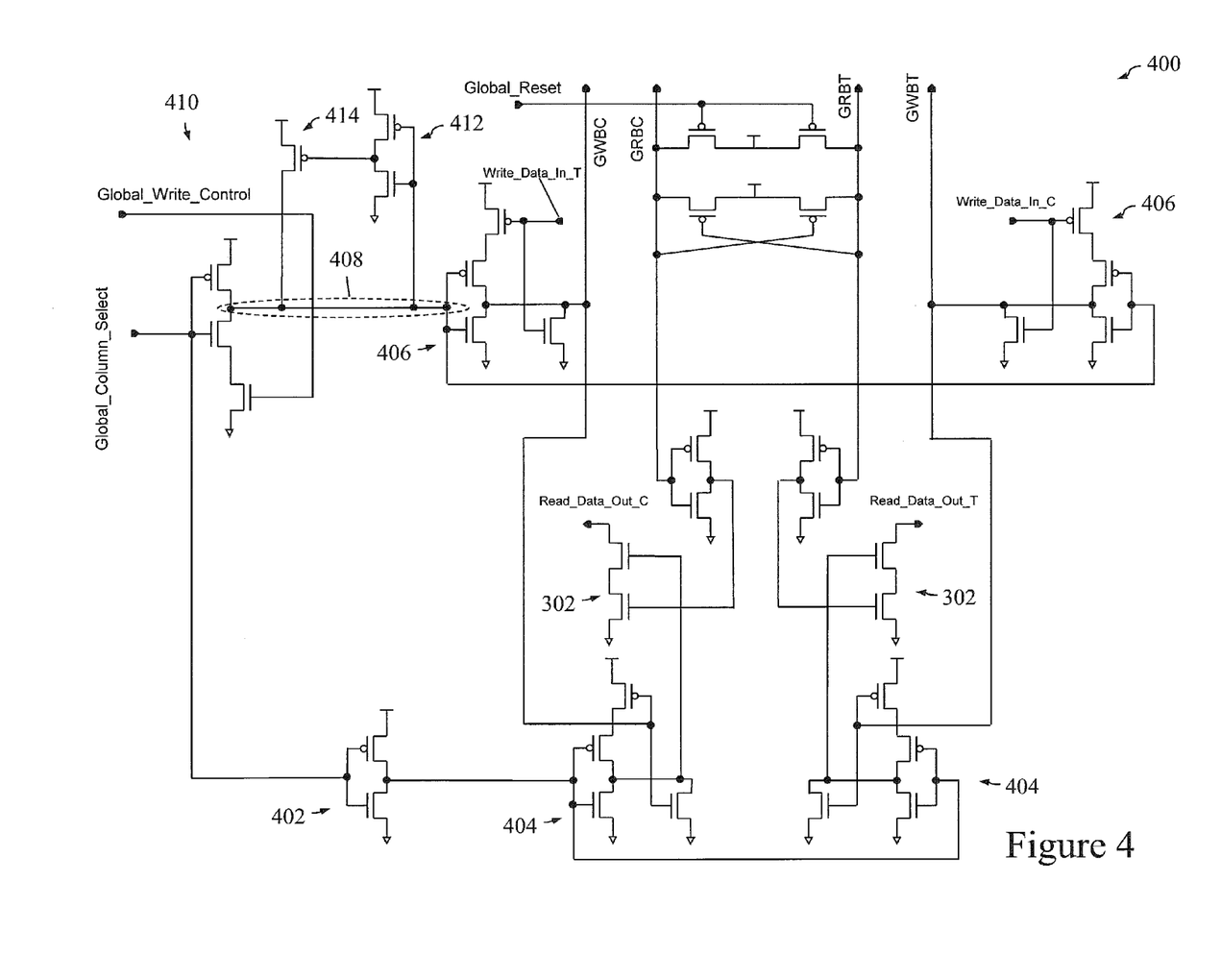
FIG. 4 is a schematic diagram of a domino SRAM global to local bit select circuit configured for false-write through data blocking capability.

FIG. 4 is a schematic diagram of a domino SRAM global to local bit select circuit 400 configured for false write-through data blocking, such as further described in Applicant's co-pending application Ser. No. 12/713,636, publication US2011/0211400, the contents of which are incorporated by reference in their entirety. At a high level, the circuit 400 utilizes blocking logic to prevent false FRBW data from producing an "X" state. Whereas the circuit 300 of FIG. 3 automatically enables both of the NFET stacks 302 to propagate data to the read data output bus during a write mode, the circuit 400 (during a write operation) only allows either the true or the complement data from propagating out. Stated another way, during a write mode, one of the pair of the NFET stacks associated with Read_Data_Out_C and Read_Data_Out_T in the circuit 400 is automatically disabled, depending upon the value of the write data itself.

For purposes of clarity, similar components of the global to local bit select circuit 400 with respect to that of FIG. 3 are designated with the same reference numbers and characters in FIG. 4 where applicable. In addition, the description of similar circuit devices, such as the precharging PFETs, "keep-quiet" PFETs and global write control circuitry is also omitted. As will first be noted from FIG. 4, the circuit 400 (rather than using only the Global_Column_Select signal to control the activation of the NFET stacks) replaces the inverter pair (P2/N2 and P5/N12) of FIG. 3 with a single inverter 402 and parallel NOR gates 404 in FIG. 4. The outputs of the NOR gates 404 are in turn used to control the activation of the NFET stacks 302 associated with Read_Data_Out_C and Read_Data_Out_T. The inverted value of Global_Column_Select represents only one of the two inputs to each NOR gate 404. The second input to the NOR gates 404, as will be seen from FIG. 4, is derived from the global write data itself. More specifically, the NOR gates 404 receive as second inputs thereto signals originating from Write_Data_In_C and Write_Data_In_T.

In the exemplary circuit 400 of FIG. 4 (in contrast to FIG. 3), the global write bit lines are precharged to a logic low value. Accordingly, the global write control circuitry includes an additional pair of parallel NOR gates 406, the outputs of which are coupled to GWBC and GWBT. One of the inputs of the NOR gates 406 corresponds to the input write data presented on Write_Data_In_T and Write_Data_In_C. (It will be noted that the true input write data is coupled to the NOR gate associated with the complementary global bit line, and vice versa) The other input to each NOR gate 406 is an output node 408 of a dynamic NAND gate 410, the inputs of which are the Global_Write_Control signal and the Global_Column_Select signal.

In a standby state, the Global_Column_Select signal is deactivated, which initially charges node 408 high. In order to maintain stability of the node 408, the dynamic NAND gate 410 includes a feedback mechanism wherein an inverter 412 initially causes a keeper PFET 414 to maintain the node 408 at logic high potential. Thus, in a read mode of operation, when Global_Column_Select goes high while Global_Write_Control stays off, the keeper PFET 414 holds node 408 high. Consequently, since node 408 is high in the read mode, the outputs of NOR gates 406 are low, in turn rendering the outputs of NOR gates 404 high (by virtue of the low output of inverter 402). The NFET stacks 302 of the circuit 400 are thus ready to read out the cell data.

In the write mode, both the Global_Write_Control signal and the Global_Column_Select signal are active high. As node 408 begins to be pulled to ground, inverter 412 in the dynamic NAND gate 410 begins to deactivate keeper PFET 414 until it no longer opposes the discharge of node 408. Once node 408 is discharged, the differential input write data will be coupled to GWBC and GWBT by NOR gates 406. Upon one of GWBC and GWBT becoming charged to logic high, the corresponding one of the NFET stacks 302 will be deactivated. Thus, the end result is to prevent a condition where both Read_Data_Out_C and Read_Data_Out_T are being discharged as a result of a Fast Read Before Write scenario.

During a traditional "write-through" operation, input data is sent to a global bit select circuit. This data then propagates to local column circuitry (i.e., local bit select circuits), and is presented to a selected memory cell before being sent back down to the global bit select circuit by way of the global read bit lines. It is desirable, however, to save time by getting this input data more quickly to the output circuits without the need for the local bit select circuitry to resend the data back to the global bit select circuitry, thereby speeding up write-through performance. On the other hand, it is also desirable to be able to achieve this improved performance without the need for adding new critical timing path or clock circuits.

Figure 5:
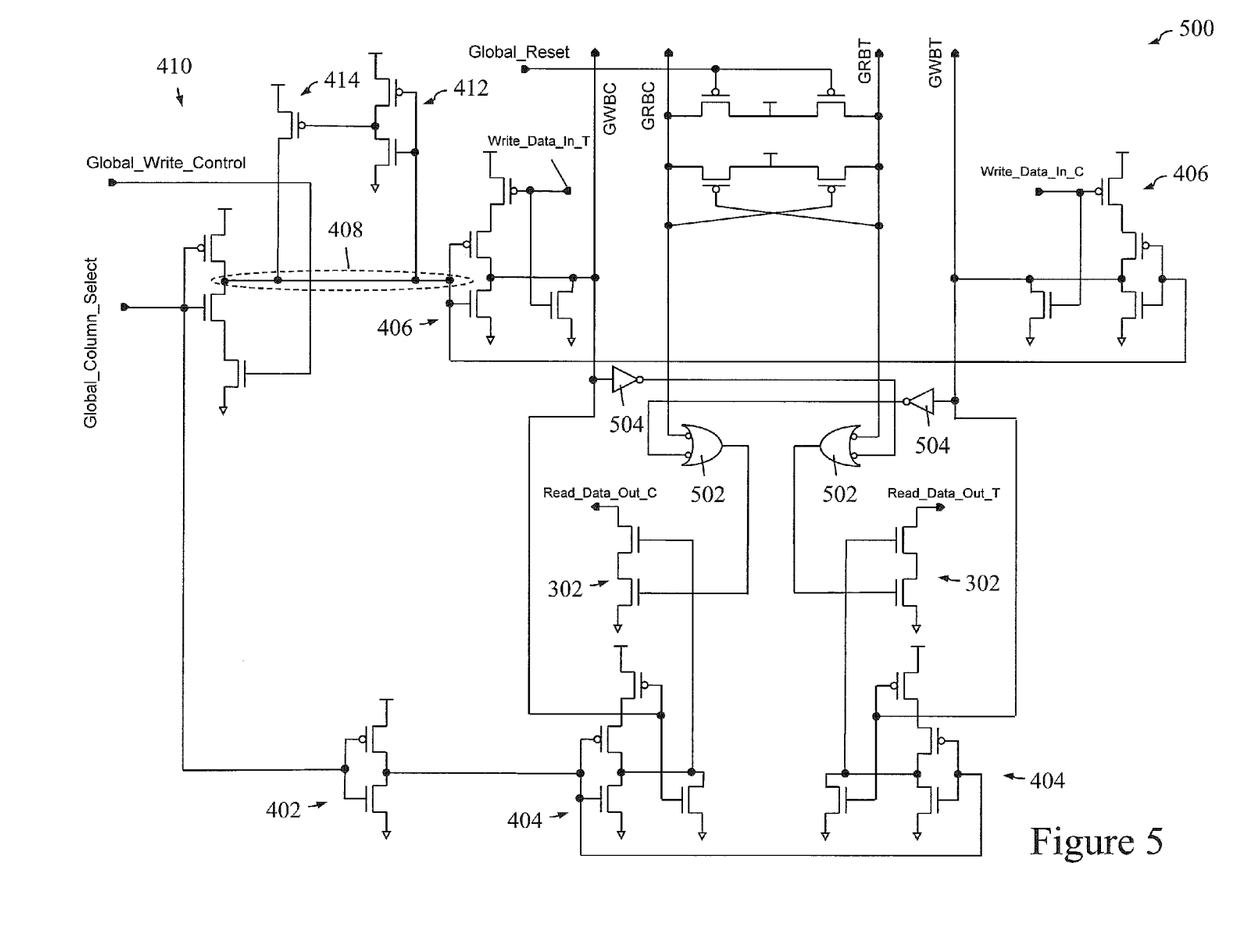
FIG. 5 is a schematic diagram of a domino SRAM global to local bit select circuit similar to FIG. 4, and further configured for write-around capability in accordance with an exemplary embodiment.

Accordingly, FIG. 5 is a schematic diagram of a domino SRAM global to local bit select circuit 500 further configured for write-around capability, in accordance with an exemplary embodiment. As is illustrated in FIG. 5, in lieu of using inverters for coupling output data from the global read bit line pair to the NFET stacks 302, the circuit 500 instead uses write-around logic that includes inverted input OR (NAND) logic 502, the outputs of which are coupled to the NFET stacks 302. A first input to the NAND logic 502 is the data from the global read bit line pair (GRBC, GRBT) in accordance with a normal read operation. In addition, a second input to the NAND logic 502 originates from the global write bit line pair (GWBC, GWBT). More specifically, inverters 504 couple the global write bit line pair to the opposite side OR logic since the global write bit line pair is precharged low.

For a normal read operation, the global write bit line pair is precharged low, and the inverted logic high outputs therefrom serve as a control bit to the opposing NAND gate 502. That is, the NAND gates 502 reduce to an inverter function for the data coming from the global read bit line pair (GRBC, GRBT). In this instance, the circuit 500 reads selected cell data as described above.

However, for a write mode, the initially precharged high global read bit line pair (GRBC, GRBT) serve as control bits to the respective NAND gates 502, reducing them to an inverter function for the data on the global write bit line pair (GWBC, GWBT). This enables the complementary write data pair on GWBC, GWBT to be immediately passed to the read data output NFET stacks 302 without having to travel up the global/local write bit lines, to the data cell, and back down the local/global read bit lines. Moreover, this write through capability is implemented with no additional gate delays and with only a minor loading impact using a NAND gate instead of an inverter on the global read bit lines.

Figure 6:
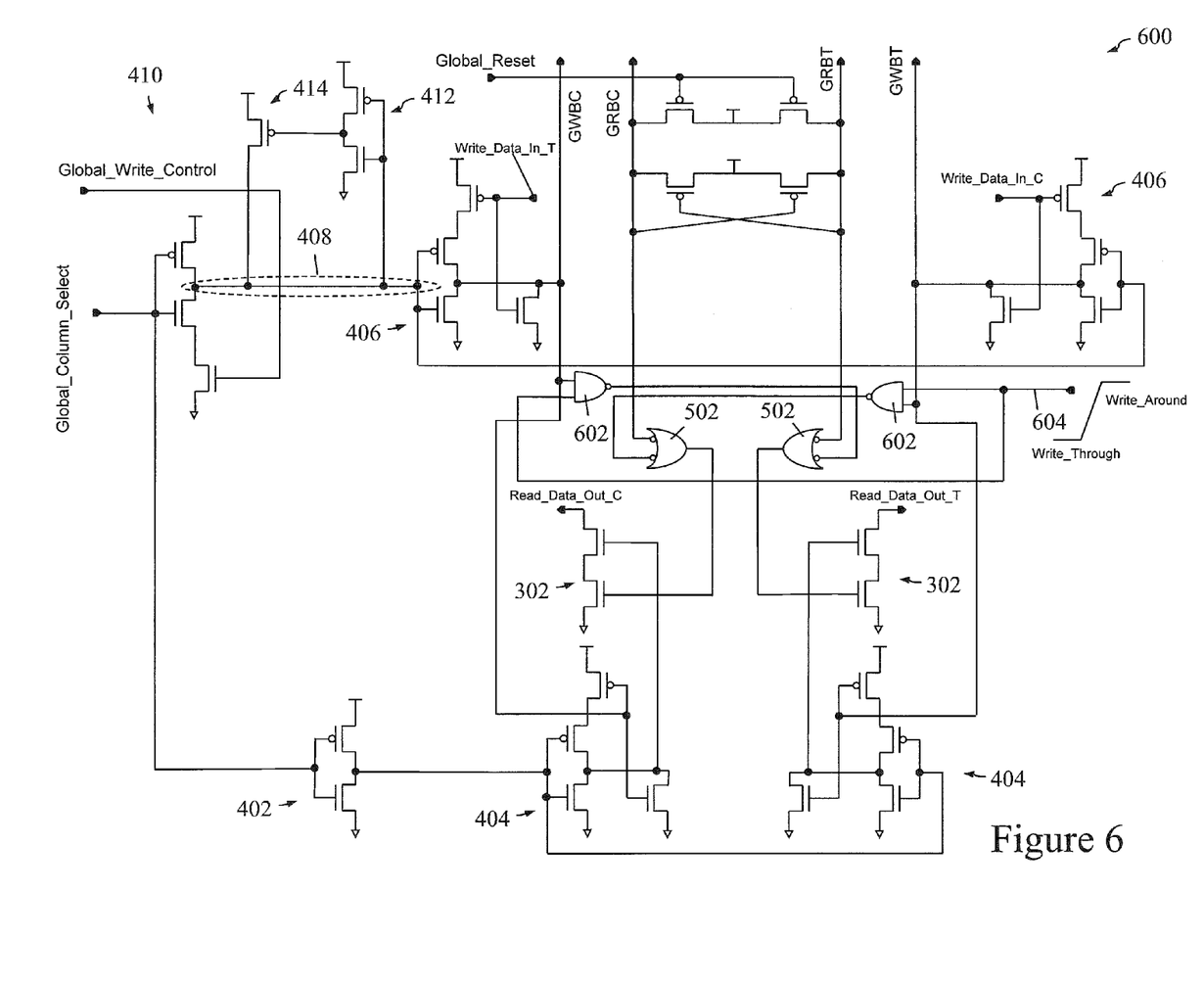
FIG. 6 is a schematic diagram of a domino SRAM global to local bit select circuit configured for write-around capability, in accordance with another exemplary embodiment.

In the event that a traditional write-through function is still desired, such as for circuit testing for example, an additional circuit modification may be provided such that write-around function is switched off. In this regard, FIG. 6 is a schematic diagram of a domino SRAM global to local bit select circuit 600 configured for write-around capability, in accordance with another exemplary embodiment. In this embodiment, the global bit line inverters 504 of FIG. 5 are replaced with NAND gates 602, with a first input to the NAND gates 602 being the global bit lines GWBC, GWBT. The second input to each NAND gate 602 is a new control signal "Write_Through/Write_Around" 604 which allows for either the new write-around functionality described above in FIG. 5 or the traditional write-through functionality also described above.

When the control signal 604 is logic high (i.e., the write-around capability), the NAND gates 602 reduce to inverters as shown in FIG. 5 and write data is immediately sent to the read data output NFET stacks 302 as described above. However, when the control signal 604 is logic low (i.e., the write-through capability), the outputs of NAND gates 602 are held high. In turn, this isolates any write data directly from the read data output NFET stacks 302, and reduces the NAND logic 502 to inverters. That is, the write data must be first written into the memory cell via global/local bit lines and then read back out from the memory cell via local/global bit lines before it appears at the output NFET stacks 302. Again, such a feature may be desirable during logic device testing to, for example, determining the integrity of data lines. It should further be appreciated that the write-around logic of the embodiments of FIGS. 5 and 6 need not necessarily be combined with the blocking logic introduced in FIG. 4, and can be used in other types of global column select circuits.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A global to local bit line interface circuit for domino static random access memory (SRAM) devices, the circuit comprising:
    a pair of complementary global write bit lines in selective communication with an array of SRAM cells through corresponding local write bit lines, the complementary global write bit lines configured to write a selected SRAM cell with write data presented on a pair of complementary write data input lines;
    a pair of complementary global read bit lines in selective communication with the array of SRAM cells through corresponding local read bit lines, the complementary global read bit lines configured to read data stored in a selected SRAM cell and present the read data on a pair of complementary read data output lines; and
    write-around logic configured to directly couple the write data presented on the complementary global write bit lines to read data output circuitry associated with the complementary global read bit lines.

2. The circuit of claim 1, wherein the write-around logic further comprises NAND logic coupled between the complementary global read bit lines and the read data output circuitry.

3. The circuit of claim 2, wherein a first input to the NAND logic is coupled to one of the complementary global read bit lines and a second input to the NAND logic is coupled to an inverted output of one of the complementary global write bit lines.

4. The circuit of claim 2, wherein the NAND logic comprises inverted input OR gates.

5. The circuit of claim 4, wherein the write-around logic is configured to be selectively bypassed such that the write data presented on the complementary global write bit lines is prevented from being directly coupled to the read data output circuitry, and the write data is instead written to the selected SRAM cell via the corresponding local write bit lines, and read from the selected SRAM cell via the corresponding local read bit lines.

6. The circuit of claim 4, further comprising NAND gates coupled between the global write bit line pair and the inverted input OR gates, the NAND gates each having a control signal as a first input thereto that controls selective bypassing of the write-around logic.

7. The circuit of claim 6, wherein a second input to the NAND gates comprises one of the global write bit line pair.

8. The circuit of claim 1, further comprising blocking logic configured to prevent, during a write operation, propagation of stored data from the SRAM cells out on the complementary read data output lines, via the complementary global read bit lines, prior to completion of the write operation by ensuring that one of the complementary read data output lines is maintained at a precharged level, regardless of the value of any data present on the complementary global read bit lines during the write operation.

9. The circuit of claim 8, wherein the blocking logic is controlled by signals present on the complementary global write bit lines.

10. The circuit of claim 8, wherein the blocking logic further comprises a pair of NFET stacks coupled to the complementary read data output lines, wherein activation of the NFET stacks for a read operation is controlled by a first pair of parallel configured NOR gates, a first input of which is controlled by a global column select signal and a second input of which is controlled by one of the complementary global write bit lines.

11. A method of implementing reading and writing data in domino static random access memory (SRAM) devices, the method comprising:
    selectively coupling a pair of complementary global write bit lines in with an array of SRAM cells through corresponding local write bit lines, the complementary global write bit lines configured to write a selected SRAM cell with data presented on a pair of complementary write data input lines;
    selectively coupling a pair of complementary global read bit lines with the array of SRAM cells through corresponding local read bit lines, the complementary global read bit lines configured to read data stored in a selected SRAM cell and present the read data on a pair of complementary read data output lines; and
    configuring write-around logic to directly couple the write data presented on the complementary global write bit lines to read data output circuitry associated with the complementary global read bit lines.

12. The method of claim 11, wherein the write-around logic further comprises NAND logic coupled between the complementary global read bit lines and the read data output circuitry.

13. The method of claim 12, wherein a first input to the NAND logic is coupled to one of the complementary global read bit lines and a second input to the NAND logic is coupled to an inverted output of one of the complementary global write bit lines.

14. The method of claim 12, wherein the NAND logic comprises inverted input OR gates.

15. The method of claim 14, wherein the write-around logic is configured to be selectively bypassed such that the write data presented on the complementary global write bit lines is prevented from being directly coupled to the read data output circuitry, and the write data is instead written to the selected SRAM cell via the corresponding local write bit lines, and read from the selected SRAM cell via the corresponding local read bit lines.

16. The method of claim 14, further comprising configuring NAND gates coupled between the global write bit line pair and the inverted input OR gates, the NAND gates each having a control signal as a first input thereto that controls selective bypassing of the write-around logic.

17. The method of claim 16, wherein a second input to the NAND gates comprises one of the global write bit line pair.

18. The method of claim 11, further comprising configuring blocking logic to prevent, during a write operation, propagation of stored data from the SRAM cells out on the complementary read data output lines, via the complementary global read bit lines, prior to completion of the write operation by ensuring that one of the complementary read data output lines is maintained at a precharged level, regardless of the value of any data present on the complementary global read bit lines during the write operation.

19. The method of claim 18, wherein the blocking logic is controlled by signals present on the complementary global write bit lines.

20. The method of claim 19, wherein the blocking logic further comprises a pair of NFET stacks coupled to the complementary read data output lines, wherein activation of the NFET stacks for a read operation is controlled by a first pair of parallel configured NOR gates, a first input of which is controlled by a global column select signal and a second input of which is controlled by one of the complementary global write bit lines.

* * * * *